United States Patent
Gotoh et al.

(10) Patent No.: US 6,660,943 B1
(45) Date of Patent: Dec. 9, 2003

(54) UNDERFILLING MATERIAL FOR SEMICONDUCTOR PACKAGE

(75) Inventors: Johshi Gotoh, Nishinomiya (JP); Tatsuya Okuno, Kurita-gun (JP)

(73) Assignees: Sunstar Giken Kabushiki Kaisha, Takatsuki (JP); UNI-Sunstar B.V., Amsterdam (NL)

( * ) Notice: Subject to any disclaimer, the term of this patent is extended or adjusted under 35 U.S.C. 154(b) by 0 days.

(21) Appl. No.: 10/019,299

(22) PCT Filed: Jul. 6, 2000

(86) PCT No.: PCT/JP00/04490

§ 371 (c)(1), (2), (4) Date: Mar. 11, 2002

(87) PCT Pub. No.: WO01/05203

PCT Pub. Date: Jan. 18, 2001

(30) Foreign Application Priority Data

Jul. 8, 1999 (JP) .................................. 11-194501

(51) Int. Cl.[7] .................................................. H05K 1/16
(52) U.S. Cl. ....................... 174/260; 257/738; 257/788; 29/841; 438/126; 438/127
(58) Field of Search ........................ 174/260; 438/108, 438/126, 127; 29/840, 841; 257/787–789, 737, 738, 778

(56) References Cited

U.S. PATENT DOCUMENTS

| | | | | |
|---|---|---|---|---|
| 4,499,149 A | * | 2/1985 | Berger | 428/447 |
| 5,061,776 A | | 10/1991 | Weaver et al. | |
| 5,249,101 A | * | 9/1993 | Frey et al. | 361/717 |
| 5,288,944 A | * | 2/1994 | Bronson et al. | 174/52.4 |
| 5,386,624 A | * | 2/1995 | George et al. | 29/832 |
| 5,390,082 A | * | 2/1995 | Chase et al. | 361/783 |
| 5,450,283 A | * | 9/1995 | Lin et al. | 361/704 |
| 5,533,256 A | * | 7/1996 | Call et al. | 29/840 |
| 5,641,996 A | * | 6/1997 | Omoya et al. | 257/787 |
| 5,804,882 A | * | 9/1998 | Tsukagoshi et al. | 257/783 |
| 5,929,512 A | * | 7/1999 | Jacobs | 257/667 |
| 6,037,043 A | * | 3/2000 | Lehner et al. | 428/209 |
| 6,121,070 A | * | 9/2000 | Akram | 438/108 |
| 6,252,308 B1 | * | 6/2001 | Akram et al. | 257/787 |
| 6,406,990 B1 | * | 6/2002 | Kawai | 438/612 |
| 6,492,204 B1 | * | 12/2002 | Jacobs | 438/127 |
| 6,507,101 B1 | * | 1/2003 | Morris | 257/706 |
| 6,534,858 B2 | * | 3/2003 | Akram et al. | 257/706 |

FOREIGN PATENT DOCUMENTS

| | | |
|---|---|---|
| EP | 0757067 A1 | 3/1995 |
| JP | 2713760 B | 9/1990 |
| JP | 2738487 B | 6/1994 |
| JP | 10204259 A | 8/1998 |
| JP | 2000-220481 | 1/2000 |
| WO | WO 98/31738 | 1/1998 |

OTHER PUBLICATIONS

"Solder Joint Life Improvement Using Adhesive Under Component", Research Disclosure—2244—(Jan., 1990) No. 309, New York, US—XP 000099320.

* cited by examiner

*Primary Examiner*—David E. Graybill
*Assistant Examiner*—Jose H. Alcala
(74) *Attorney, Agent, or Firm*—Jacobson Holman PLLC

(57) ABSTRACT

An underfilling material for a semiconductor package holding semiconductor elements on a carrier substrate mounted on a circuit board, containing a one-pack type thermosetting urethane composition which preferably comprises a urethane prepolymer having a terminal isocyanate group, which is obtained by reacting a polyol with an excessive amount of a polyisocyanate, and a fine powder-coated curing agent comprising a curing agent which is in a solid state at room temperature and surface active sites of which are covered with a fine powder. This composition can achieve both the low temperature curing properties and the storage stability.

4 Claims, 1 Drawing Sheet

UNDERFILLING MATERIAL FOR SEMICONDUCTOR PACKAGE

This is a 371 of PCT/JP00/004490 filed Jul. 6, 2000, published in English, the disclosure of which is incorporated herein by reference.

FIELD OF THE INVENTION

The present invention relates to an underfilling material for semiconductor packages. In particular, the present invention relates to an underfilling material which is used when a semiconductor package holding semiconductor elements on a carrier substrate is mounted onto a circuit board, a mounted board produced by such mounting, and a repairing method of a mounted board.

PRIOR ART

The above-described type of the mounted board is used in applications requiring high reliance such as automobile equipment, computers, and the like, and also mobile phones which have been mass-produced with the wide spread thereof. In general, such a mounted board is produced by mounting a semiconductor package holding semiconductor elements on a carrier substrate to a circuit board, that is, by bonding the semiconductor package onto the circuit board with solder balls.

In the case of mobile phones, bond-failure of the solder ball may occur by the deformation of the substrate caused by falling shock, external pressure generated with the operation of buttons, etc. Thus, a reinforcing method is employed by filling an underfilling material in spaces around the solder-bonded parts and curing it to seal them. As the underfilling material used to improve the reliability of the connection by reinforcing, one-pack type or two-pack type thermosetting epoxy-based materials containing epoxy resins, curing agents and plasticizers are widely and mainly used (cf. JP-A-10-204259).

However, the epoxy-based materials should be thermally cured for 30 minutes at 80° C. or 10 minutes at 150° C. When the low temperature curing properties are enhanced by the adjustment of compositions, the epoxy-based materials should be stored at a low temperature of about 5° C. or less. In addition, when the epoxy-based materials are used as the underfilling materials, and the connection failures are found, the cured products, which are bonded to the circuit board, should be removed one by one, by heat melting them and/or swelling them with solvents in the repairing works after detaching the semiconductor package from the circuit board. Therefore, the conventional epoxy-based materials do not have satisfactory repairing properties required at the work spot.

SUMMARY OF THE INVENTION

One object of the present invention is to provide an underfilling material for a semiconductor package, which can achieve both the low temperature curing properties and the storage stability, and solve the above problems in repairing, that is, an underfilling material which can be cured at a temperature of at least 60° C., for example, at 70° C. for 20 minutes or at 80° C. for 10 minutes, and can be stored at room temperature.

Another object of the present invention is to provide a novel mounted board comprising a semiconductor package holding semiconductor elements on a carrier substrate which is mounted on a circuit board.

A further object of the present invention is to provide a method for easily repairing a mounted board.

According to the first aspect of the present invention, there is provided a mounted board comprising a circuit board and a semiconductor package holding semiconductor elements on a carrier substrate, wherein said semiconductor package is connected to said circuit board with solder balls, and spaces between solder connected parts are filled with an underfilling material which consists essentially of a one-pack type thermosetting urethane composition.

According to the second aspect of the present invention, there is provide a method for producing a mounted board of the present invention, comprising the steps of:
  connecting said semiconductor board to said circuit board with said solder balls,
  then filling the spaces between solder connected parts with said underfilling material, and
  curing said underfilling material to seal said mounted board.

According to the third aspect of the present invention, there is provided a method for producing a mounted board of the present invention comprising the steps of:
  applying the surface of said circuit board with said underfilling material,
  connecting said semiconductor board to said circuit board with said solder balls,
  and curing said underfilling material to seal said mounted board.

According to the fourth aspect of the present invention, there is provide an underfilling material for a semiconductor package holding semiconductor elements on a carrier substrate mounted on a circuit board, consisting essentially of a one-pack type thermosetting urethane composition.

According to the fifth aspect of the present invention, there is provided a method for repairing a mounted board of claim 1 comprising the steps of:
  partly heating at least one of said semiconductor package and said circuit board to a temperature in the range between 180° C. and 350° C.,
  melting said cured underfilling material and optionally said solder,
  removing said semiconductor package from said circuit board and
  mounting said semiconductor package or a new semiconductor package on said circuit board.

DETAILED DESCRIPTION OF THE INVENTION

Figure 1:
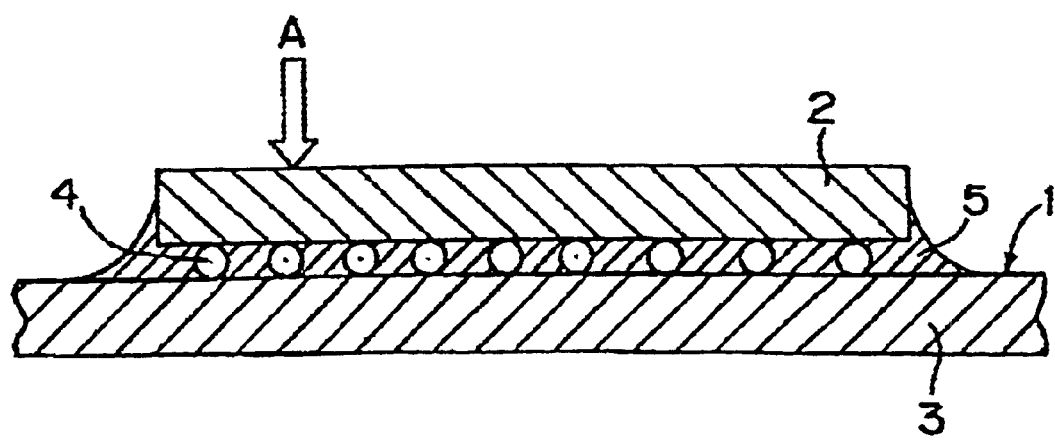
FIG. 1 is a schematic cross section of the mounted board according to the present invention.

A typical example of a one-pack type thermally curable urethane composition to be used according to the present invention is a urethane composition comprising a urethane prepolymer having a terminal isocyanate group which is prepared by the reaction of a polyol with an excessive amount of polyisocyanate (hereinafter referred to as "NCO-containing prepolymer"), and a fine powder-coated curing agent comprising a curing agent which is in a solid state at room temperature and the surface active sites of which are covered with a fine powder.

This urethane composition may contain any conventional additives such as plasticizers (e.g. ester plasticizers based on phthalic acid, isophtalic acid, adipic acid, azelaic acid, sebacic acid, maleic acid, fumaric acid, trimellitic acid, pyromellitic acid, phosphoric acid, sulfonic acid, etc.); adhesive promoters, for example, silane coupling agents (e.g. mercaptosilane, epoxysilane, vinylsilane, etc.), titanate coupling agents, aluminum coupling agents, epoxy resins, phenol resins, etc.; stabilizers (e.g. hindered phenol type, monophenol type, bis-trispolyphenol type, thiobisphenol type stabilizers, etc.); dehydrants (e.g. calcium oxide, zeolite, silca gel, etc.); dyes and pigments; and the like.

The viscosity of such a thermally curable urethane composition is usually adjusted in the range between 500 and 50,000 mPa.s, preferably between 1,000 and 20,000 mPa.s.

The NCO-containing prepolymer may be prepared by reacting a polyol and an excessive amount of a polyisocyanate. Usually, an equivalent ratio of NCO to OH is from 1.5:1 to 2.5:1, preferably from 1.9:1 to 2.2:1. The NCO-containing prepolymer has a molecular weight of 800 to 50,000, preferably 1,000 to 10,000.

Examples of the above polyol include polyetherpolyols (e.g. polyoxyalkylene polyol (PPG), modified polyetherpolyol, polytetraethylene ether glycol, etc.), polyesterpolyols (e.g. condensed polyesterpolyols, lactone-based polyesterpolyols, polycarbonatediols, etc.), polyols comprising backbones having C—C bonds (e.g. acrylpolyols, polybutadiene polyols, polyolefine polyols, caster oil, etc.), and the like.

Examples of the above polyisocyanate include tolylene diisocyanate (TDI), 4,4'-diphenylmethane diisocyanate, xylylene diisocyanate, hexamethylene disocyanate, isophorone diisocyanate, lysin diisocyanate, isopropylidenebis(4-cyclohexylisocyanate), hydrogenated xylylene diisocyanate, etc.

The NCO-containing prepolymer prepared using a polyetherpolyol as a polyol (PPG type prepolymer) or, in particular, a hydrocarbon polyol as a polyol (PH type prepolymer) is advantageous, since it can impart electrical insulation to the material, but it may increase the viscosity of the material. Thus, the HC or PB type prepolymer is preferably used in combination with the NCO-containing prepolymer comprising PPG (PPG type prepolymer). In this case, a weight ratio of the HC or PB type prepolymer to the PPG type prepolymer is usually from 9:1 to 2:8, preferably from 9:1 to 5:5. Furthermore, a NCO-containing prepolymer, which is prepared by reacting a mixture of the PB type polyol and PPG in a specific ration with an excessive amount of a polyisocyanate, may be used.

The fine powder coated curing agent may be prepared with a shear-friction mixing system by grinding the curing agent which is in the solid state at room temperature to a median particle size of 20 μm or less while adding thereto the fine powder in a weight ratio of the curing agent to the fine powder in the range between 1:0.001 to 1:0.7, preferably between 1:0.01 to 1:0.5, and mixing and grinding them so that the median particle size of the fine powder becomes 2 μm or less, whereby the fine powder is adhered to the surface of the particles of the solid curing agent.

Alternatively, the fine powder-coated curing agent may be prepared by mixing the finely preground solid curing agent and the fine powder with a high speed impact type mixer (e.g. jet mill) or a compression shear type mixer. The use of the high speed impact type mixer is preferable.

Examples of the curing agent which is in the solid state at room temperature include imidazole compounds (e.g. imidazole, 2-methylimidazole, 2-ethylimidazole, 2-ethyl-4-methylimidazole, 2-isopropylimidazole, 2-phenylimidazole, 2-dodecylimidazole, 2-undecylimidazole, 2-heptadecyl imidazole, their salts with carboxylic acids such as acetic acid, lactic acid, slicylic acid, benzoic acid, adipic acid, phthalic acid, citric acid, tartaric acid, maleic acid, trimellitic acid, etc.); imidazoline compounds (e.g. 2-methylimidazoline, 2-phenylimidazoline, 2-undecylimidazoline, 2-heptadecylimidazoline, 1-(2-hydroxy-3-phenoxypropyl)-2-phenylimidazoline, 1-(2-hydroxy-3-butoxypropyl)-2-methylimidazoline, etc.); aromatic amine compounds (e.g. 4,4'-, 2,4'-, 3,3'- or 3,4'-diaminodiphenylmethane, 2,2'- 2,4'- or 3,3'-diaminobiphenyl, 2,4- or 2,5-diaminophenol, o- or m-phenylenediamine, 2,3-, 2,4-2,5-, 2,6- or 3,4-tolylenediamine, etc.); aliphatic amine compounds (e.g. 1,8-octanediamine, 1,10-decanediamine, 1,12-dodecanediamine, 1,14-tetradecanediamine, 1,16-hexadecanediamine, etc.); guanidine compounds (e.g. dicyanediamine, etc.); acid anhydrides (e.g. phthalic anhydride, tetrahydrophthalic anhydride, hexahydrophthalic anhydride, methylated hexahydrophthalic anhydride, trimellitic anhydride, etc.); dibasic carboxylic acid dihydrazide (e.g. acipic acid dihydrazide, sebacic acid dihydrazide, etc.); guanamines (e.g. benzoguanamine, etc.); melamine; amine adducts (e.g. adducts of 2-ethyl-4-methylimidazole and bisphenol A epoxy resins, etc.); and the like.

Examples of the fine powder include inorganic powders (e.g. titanium oxide, calcium carbonate, clay, silica, zirconia, carbon, alumina, talc, etc.); and organic powder (e.g. polyvinyl chloride, acrylic resins, polystyrene, polyethylene, etc.); and the like.

When the solid curing agent and the fine powder are mixed and ground, static electricity may be generated and thus the fine powder may be adhered to the surfaces of the particles of the solid curing agent, or the particles of the solid curing agent may be partially molten with a heat due to friction, impact or compression shear generated with the mixer and thus the fine powder is adhered to the surfaces of the particles of the solid curing agent, or the fine powder may be physically anchored in the surfaces of the particles of the solid curing agent, or the surfaces of the particles of the solid curing agent may be chemically activated and thus the fine powder may be adhered to the surfaces of the particles of the solid curing agent. Accordingly, the active groups such as —NH$_2$ or —NH groups on the surfaces of the particles of the solid curing agent can be coated with the fine powder.

The fine powder-coated curing agent can be activated by heating at a temperature equal to or higher than the melting point of the solid curing agent, and therefore, the active groups, which are reactivated by heating, contribute to the curing reaction with the NCO groups of the NCO-containing prepolymer.

The amount of the fine powder-coated curing agent may be selected so that the curing agent is present in substantially an equivalent amount to the NCO-containing prepolymer.

Another example of the one-pack type thermally curable urethane composition includes a polyisocyanate the NCO group of which is inactivated with a blocking agent (e.g. phenol type, oxime type or lactam type blocking agents), or a combination of an inactivated polyisocyanate, which is in the solid state at room temperature, with a curing agent (e.g. polyols, polyamines, etc.). The polyisocyanate may be that used in the above preparation of the NCO-containing prepolymer.

Furthermore, a combination of a polyisocyanate with a inactivated polyamine curing agent.

Preferably, the one-pack type thermally curable urethane composition of the present invention may further contain an epoxy resin, an organosilicone and/or a dehydrant.

The epoxy resin increases the physical properties of the cured product of the urethane composition of the present invention.

The amount of the epoxy resin may be from 5 to 30 wt. %, preferably from 7 to 20 wt. %, based on the weight of the urethane composition.

When the amount of the epoxy resin is less than 5 wt. %, the physical properties of the urethane composition of the present invention may not be improved. When the amount of the epoxy resin exceeds 30 wt. %, the viscosity of the urethane composition of the present invention tends to increase so that the workability and penetrability deteriorate.

The epoxy resin may be any conventionally used epoxy resin. Specific examples of the epoxy resin include the following ones:

(1) Glycidylamine epoxy resins

Epoxy resins having at least one N,N-diglycidylamino group, such as N,N,N',N'-tetraglycidylaminodiphenylmethane, N,N-diglycidyl-m- or p-aminophenol glycidyl ether and their condensates. They are commercially sold under ARALDITE® MY 720 (available from Ciba-Geigy), and EPOTOTE® 434 and YH 120 (both available from TOTO KASEI KABUSHIKIKAISHA).

(2) Novolak epoxy resins

Phenolic novolak epoxy resins such as EPIKOTE152 and 152 (both available from Shell Chemical), DOW EPOXY RESIN DEN 431, 438, 439 and 485 (all available from Dow Chemical), RE-3055 (available from NIPPON KAYAKU), etc. Cresol novolak epoxy resins such as ECN 1235, 1273, 1280 and 1299 (all available from Ciba-Geigy), EOCN 100, 102, 103 and 104 and EOCN-1020, 1025, 1027 3300 and 4400 (all available from NIPPON KAYAKU), QUATREX 3310, 3410 and 3710 (all available from Dow Chemical), etc.

(3) Bisphenol A epoxy resins

Bisphenol A epoxy resins such as EPIKOTE® 828, 834, 827, 1001, 1002, 1004, 1007 and 1009 (all available from YUKA SHELL), DOW EPOXY DER 331, 332, 662, 663U and 662U (all available from Dow Chemical), ARALDITE® 6071, 7071 and 7072 (all available from Ciba-Geigy), EPICRONE 840, 850, 855, 860, 1050, 3050, 4050 and 7050 (all available from DAINIPPON INK AND CHEMICALS), RE-310S and RE-410S (both available from NIPPON KAYAKU), etc. Urethane-modified bisphenol A epoxy resins such as ADEKA RESIN EPV-6, EPV-9 and EPV-15 (all available from ASAHI DENKA KOGYO), etc. Brominated bisphenol A epoxy resins such as ARALDITE® 8011 (available from Ciba-Geigy), DOW EPOXY RESIN DER 511 (available from Dow Chemical), etc.

(4) Alicyclic epoxy resins

ARALDITE® CY-179, CY-178, CY-182 and CY-183 (all available from Ciba-Geigy).

(5) Other epoxy resins

Bisphenol F epoxy resins such as EPIKOTE® 807 (available from YUKA SHELL), RE-304S, RE-403S and RE-404S (all available from NIPPON KAYAKU), S-129 and 830S (both available from DAINIPON INK AND CHEMICALS). Resorcinol epoxy resins, tetrahydroxyphenylethane epoxy resins, polyalcohol epoxy resins, polyglycol epoxy resins, glyceroltriether epoxy resins, polyolefin epoxy resins, epoxidized soybean oil, ester epoxy resins, phenolic epoxy resins, naphthalene epoxy resins, flame-retarded epoxy resins, and the like.

Among the above epoxy resins, the epoxy resins which are in the liquid state at room temperature, can be used as such, while those which are in the solid state at room temperature may be heated to their melting points and molten, or solved by the co-use of the liquid epoxy resins.

The organosilicone compound can improve the adhesion properties and wettability. The organosilicone compound may be at least one compound selected from the group consisting of silane coupling agents, organopolysilicones having terminal silanol groups, polyether-modified silicones and modified organosilicones.

The amount of the organosilicone compound is usually from 0.01 to 5.0 wt. %, preferably from 0.05 to 5.0 wt. %, based on the weight of the urethane composition.

When the amount of the organosilicone compound is less than 0.01 wt. %, the adhesion properties and penetrability of the urethane composition of the present invention may not be improved. When the amount of the organosilicone compound exceeds 5 wt. %, the storage stability of the urethane composition of the present invention tends to deteriorate.

Examples of the silane coupling agent include aminosilane compounds (e.g. γ-aminopropyltriethoxysilane, β-aminoethyl-trimethoxysilane, γ-aminopropyldiethoxysilane, γ-allylaminopropyltrimethoxysilane, β-(β-aminoethylthioethyl)-diethoxymethylsilane, β-(β-aminoethylthioethyl) triethoxysilane, β-phenylaminopropyltrimethoxysilane, γ-cyclohexylaminopropyl-trimethoxysilane, γ-benzylaminopropyltrimethoxysilane, γ-(vinylbenzylaminopropyl)triethoxysilane, N-β-(aminoethyl)-γ-aminopropyltrimethoxysilane, N-β-(aminoethyl)-γ-aminopropyl-methyldimethoxysilane, β-(β-aminoethylaminomethylmethoxysilane, γ-[β-(β-aminoethylaminoethylamino)propyl]triethoxysilane, N-(3-triethoxysilylpropyl)urea, etc.), mercaptosilane compounds (e.g. 3-mercaptopropylmethyldimethoxysilane, 3-mercaptopropyltriethoxysilane, mercaptomethyltrimethoxysilane, 3-mercaptopropyltrimethoxysilane, etc.), epoxysilane compounds (e.g. β-(3,4-epoxycyclohexyl)ethyltrimethoxysilane, [2-(3,4-epoxy-4-methylcyclohexyl)propyl]methyldiethoxysilane, (3-glycidoxypropyl)methyldiethoxysilane, 3-glycidoxypropyl-trimethoxysilane, etc.), isocyanate silane compounds (e.g. γ-isocyanatepropyltriethoxysilane, γ-isocyanatepropyl-trimethoxysilane, etc.), and the like.

Examples of the silanol organopolysilicones having the terminal silanol groups include polysiloxanes of the formulas:

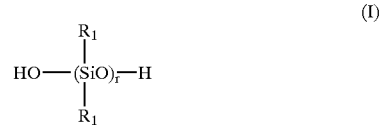

(I)

-continued

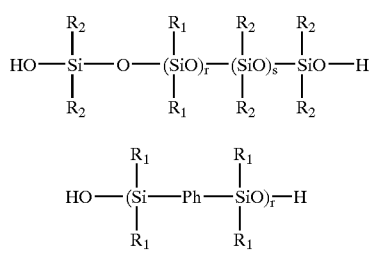
(II)

(III)

wherein $R_1$ is a methyl group or a phenyl group, $R_2$ is a phenyl group, Ph is a para-phenylene group, r is a number of 9 to 500, and s is 0 or a number of 6% or less of r. They may be used singly or in admixture of two or more.

Specific examples of the commercially available organopolysilicones having the terminal silanol groups are polydimethylsiloxane having terminal silanol groups, diphenylsiloxane having terminal silanol groups, polydimethyldiphenylsiloxane having terminal silanol groups, polytetramethyl-p-silylphenylenesiloxane, etc.

One example of the polyether-modified silicone is a compound of the formula:

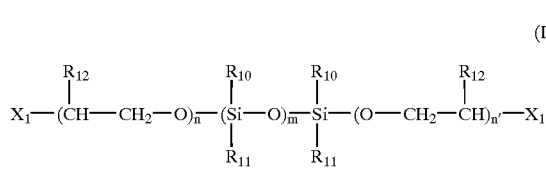
(IV)

wherein $X_1$ is —OH, —NH$_2$ or —NHR in which R is a linear or branched alkyl group having 1 to 8 carbon atoms or a phenyl group; $R_{10}$ and $R_{11}$ are the same or different and each a hydrogen atom, a methyl group or a phenyl group; $R_{12}$ is a hydrogen atom or a methyl group; m is a number of 3 to 300; n is a number of 1 to 100; and n' is a number of 1 to 100.

One example of the modified organosilicone is an organosilicone prepared by reacting (a) a silicone compound having active hydrogen atoms at both ends, (b) a polyhydric active hydrogen compound, (c) a diisocyanate compound and (d) a chain extender having active hydrogen atoms at both ends according to one of the following methods:

(i) First method:

Firstly the silicone compound having the active hydrogen atoms at both ends (a) is reacted with the diisocyanate compound (c) at a temperature of 20 to 120° C. for 10 minutes to 120 hours, optionally in the presence of a solvent to form a mono-adduct.

Examples of the solvent include ethyl acetate, butyl acetate, toluene, xylene, acetone, methyl ethyl ketone, methyl isobutyl ketone, tetrahydrofuran, etc.

Separately, the polyhydric active hydrogen compound (b) and the diisocyanate compound (c) are reacted under the same conditions as those in the above reaction to form another mono-adduct.

Then, the both mono-adducts are block addition reacted in the presence of the chain extender having the active hydrogen atoms at both ends (d) at a temperature of 20 to 120° C. for 1 to 120 hours to obtain a urethane-modified silicone resin.

(ii) Second method:

The above four components (a) to (d) are block addition reacted in a one-batch system optionally in the presence of the above solvent to obtain a urethane-modified silicone resin.

One example of the silicon compound having the active hydrogen at the both ends (a) is a compound of the formula:

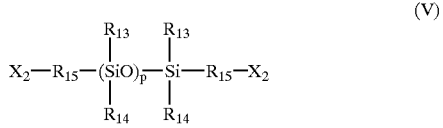
(V)

wherein $X_2$ is —OH, —NH$_2$ or —NHR in which R is the same as defined above; $R_{13}$ and $R_{14}$ are the same or different and each a hydrogen atom, a methyl group or a phenyl group, $R_{15}$ is an alkylene or alkylene ether group having 1 to 12 carbon atoms; and p is a number of 3 to 300.

The silicone compound (V) has a molecular weight of 900 to 20,000, preferably 1,800 to 10,000.

Such silicone compounds are commercially sold under the trade names KF 6001, KF6002 and KF 6003 (all available from Shin-Etsu Silicone), FM3311, FM3321 and FM4421 (all available from CHISSO), etc.

Examples of the polyhydric active hydrogen compound (b) include

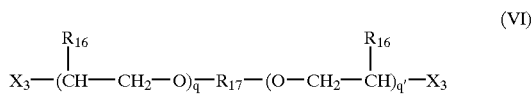
(VI)

wherein $X_3$ is —OH, —NH$_2$ or —NHR in which R is the same as defined above; $R_{16}$ is a hydrogen atom or a methyl group; $R_{17}$ is an alkylene group having 1 to 12 carbon atoms or a group of the formula:

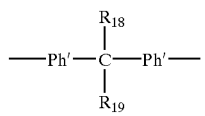

wherein $R_{18}$ and $R_{19}$ are the same or different and each a hydrogen atom or a methyl group, and Ph' is an o-, m- or p-phenylene group which may be hydrogenated; q is a number of 1 to 100; and q' is a number of 1 to 100 (e.g. polypropylene glycol, polyethylene glycol, polypropylene-ethylene glycol, propylene and/or ethylene adducts of bisphenol A), or a polyesterpolyol with hydroxyl groups at both ends comprising repeating units of the formula:

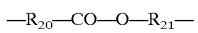

wherein $R_{20}$ is a residue of an aliphatic or aromatic dicarboxylic acid; and $R_{21}$ is a residue of an aliphatic or aromatic dihydric alcohol, provided that $R_{20}$ and/or $R_{21}$ may be the same in all the repeating units or different from the repeating units to the repeating units to provide a copolymer.

The molecular weight of the polyhydric active hydrogen compound (b) may be from 500 to 10,000, preferably from 1,000 to 3,000.

Examples of the diisocyanate compound (c) include aromatic diisocyanates (e.g. 2,4- or 2,6-tolylene diisocyanate (TDI), 4,4'-diphenylmethane diisocyanate (MDI), xylylene diisocyanate, etc.), and aliphatic diisocyanates (e.g. hexamethylene diisocyanate, lysin diisocyanate, isophorone diisocyanate, hydrogenated MDI, hydrogenated TDI, etc.).

Examples of the chain extender having the active hydrogen atoms at the both ends (d) include ethylene glycol, propylene glycol, butanediol, dimethylolcyclohexane, methyliminodiethanol, dimethylolpropionic acid, ethylenediamine, hexamethylenediamin, etc.

When a silicone compound having active hydrogen atoms at both ends of the formula:

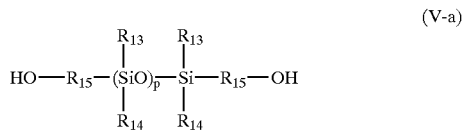

(V-a)

wherein $R_{13}$, $R_{14}$, $R_{15}$ and p are the same as defined above is used as the component (a), a bisphenol A-propylene oxide adduct of the formula:

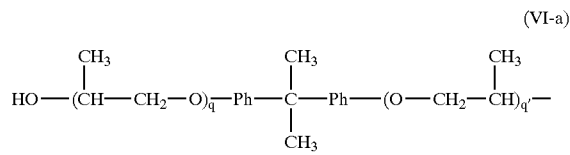

(VI-a)

wherein q and q' are the same as defined above and Ph is a para-phenylene group is used as the component (b), TDI is used as the component (c), and butanediol is used as the component (d), the modified organosilicone has a chemical structure of the formula:

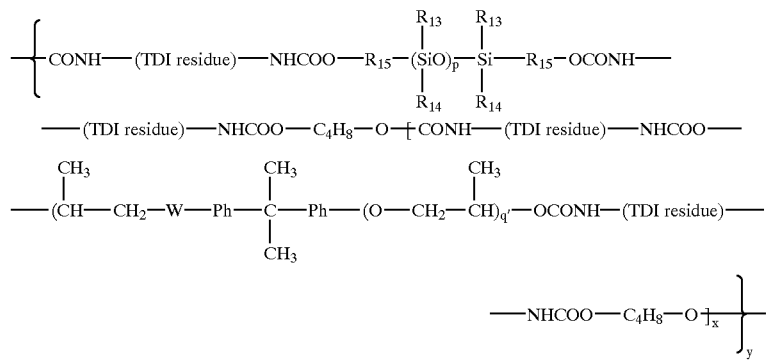

wherein $R_{13}$, $R_{14}$, $R_{15}$, p, q, q' and Ph are the same as defined above, and x is a number 1 to 10 and y is a number of 1 to 20.

A dehydrant can improve the storage stability of the urethane composition of the present invention. The amount of the dehydrant is 1 to 10 wt. %, preferably 2 to 5 wt. %, based on the weight of the urethane composition.

Examples of the dehydrant include calcium oxide, zeolite, silica gel, ethyl silicate, ethyl orthophosphate, ethyl formate, methyl orthoacetate, etc.

The one-pack type thermally curable urethane composition of the present invention may contain any conventional additives, if desired. Examples of the additives include extenders, reinforcing agents, fillers (e.g. coal tar, glass fiber, boron fiber, carbon fiber, cellulose, polyethylene powder, polypropylene powder, quartz powder, mineral silicates, mica, slate powder, kaolin, aluminum oxide trihydrate, aluminum hydroxide, chalk powder, gypsum, calcium carbonate, antimony trioxide, bentonite, silica, aerosil, lithopone, barite, titanium dioxide, carbonblack, graphite, ironoxide, goldpowder, aluminum powder, iron powder, etc.), pigments, organic solvents (e.g. toluene, xylene, methyl ethyl ketone, methyl isobutyl ketone, ethyl acetate, butyl acetate, etc.), reactive diluents (e.g. butyl glycidyl ether, N,N'-diglycidyl-o-toluidine, pheny glycidyl ether, styrene oxide, ethylene glycol diglycidyl ether, propylene glycol diglycidyl ether, 1,6-hexanediol diglycicyl ether, etc.), non-reactive diluents (e.g. dioctylphthalate, dibutylphthalate, dioctyl adipate, petroleum solvents, etc.), modified epoxy resins (e.g. urethane-modified epoxy resins, alkyd-modified epoxy resins, etc.), and the like.

The mounted board according to the present invention may be produced by any conventional methods which are employed to produce the conventional mounted boards, except that the one-pack type thermosetting urethane composition of the present invention is used as the underfilling material for the semiconduct package.

Now, one preferred embodiment of the method for the production of the mounted board according to the present invention will be explained by making reference to FIG. 1.

As shown in FIG. 1, the mounted board 1 is produced by connecting the semiconductor package 2 to the circuit board 3 with solder balls 4 each having a diameter of 300 to 800 µm at a ball pitch of 100 to 500 µm, filling the spaces between the solder balls 4 with the underfilling material 5, that is, the one-pack type thermosetting urethane composition of the present invention, using a precisely metering/ discharging apparatus for liquids, and then heating the mounted board at a temperature of 80 to 100° C. for 5 to 10 minutes to cure the urethane composition and seal the spaces.

The circuit board may be made of a resin such as a glass-reinforced epoxy resin, an ABS resin, a phenol resin, etc.

The semiconductor package may be produced holding semiconductor elements (e.g. LSI, etc.) on a carrier substrate, that is, electrically connecting the semiconductor elements and the carrier substrate with a high-melting solder, an anisotropic conductive adhesive or a wire, and sealing them with a suitable resin to increase the reliability and durability of the connections. The carrier substrate may be a substrate or a tape made of a ceramic such as $Al_2O_3$, $SiN_3$, $Al_2O_3/SiO_2$, or a heat-resistant resin such as a polyimide resin, or the resin used to produce the above circuit board.

Examples of the semiconductor package are chip size packages (CSP), ball grip arrays (BGA), and so on.

Figure 2:
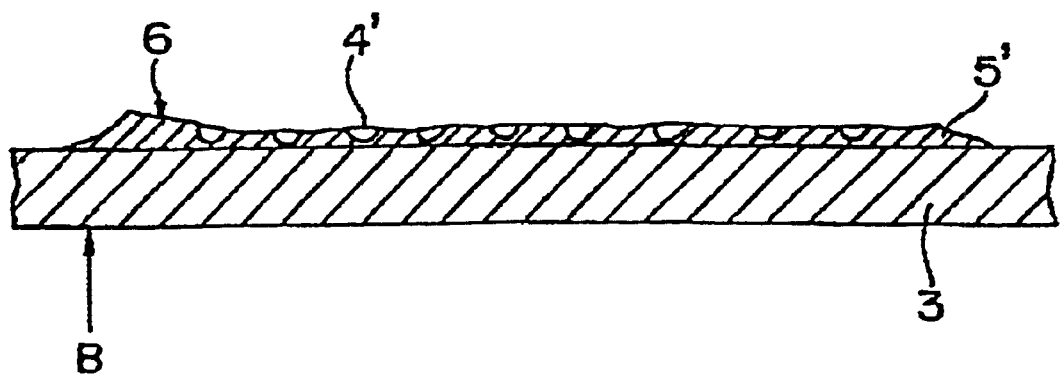
FIG. 2 is a schematic cross section of the mounted board of FIG. 1 after the semiconductor package is detached from the circuit board in the course of repairing.

If poor connection is found in the mounted board, it can be repaired by the following procedures:

i) First, as shown in FIG. 1, a part of the upper surface of the semiconductor package 2 is heated with hot air A to a temperature of 180 to 300° C. to melt the solder balls 4 in the soldered area, and the semiconductor package 2 is detached (see FIG. 2).

ii) Then, one end of the composite 6 of the remaining underfilling material 5' and the remaining solder balls 4' is pinched with a forceps or any other tool (not shown), and the composite 6 is easily peeled off from the circuit board 3, while a hot air is blown on the lower surface of the circuit board 3 to heat it to a temperature of 180 to 350° C., preferably 200 to 300° C.

After cleaning the surface of the circuit board 3, the semiconductor package is again mounted by the above procedures.

EXAMPLES

The present invention will be illustrated in detail by the following Examples.

Examples 1–4

(1) Synthesis of a NCO-containing prepolymer

A polybutadiene based polyol and TDI were reacted with the NCO/OH ratio being 2.0 to obtain a NCO-containing prepolymer having a molecular weight of 1,500 (PH-based prepolymer).

(2) Fine powder-coated curing agent 1,10-Decanediamine (melting point: 60° C.) and titanium oxide having a median particle size of 0.27 μm were mixed in a weight ratio of 1:0.3, and ground with a jet mill to obtain a fine powder-coated curing agent having a median particle size of 10 μm.

(3) Preparation of a one-pack type thermosetting urethane composition i) Firstly, a NCO-containing prepolymer prepared from PPG and TDI (SUNPRENE SEL No. 3 available from SANYO KASEI; NCO content of 3.6 %; molecular weight of 7,000) (hereinafter referred to as "PPG-based prepolymer") and the NCO-containing prepolymer prepared in the above (1) (PH-based prepolymer) were mixed in a weight ratio shown in Table 1, and cured at 80° C. for 10 minutes. Then, the physical properties (with the JIS No. 3 dumbbell shaped sample) and electrical properties of the cured product were measured. The results are shown in Table 1.

ii) Next, the mixed prepolymer No. 7 prepared in the above step i) (weight ratio of PPG-based prepolymer to PH-based prepolymer=30/70), the fine powder-coated curing agent prepared in (2), a plasticizer, a bisphenol A epoxy resin, a silane coupling agent, polydimethylsiloxane, a stabilizer and a dehydrant were homogeneously mixed in amounts (wt. parts) of Table 2 to obtain a one-pack type thermosetting urethane composition having a viscosity shown in Table 2 (at 23° C.).

(4) Performance tests

The prepared composition was subjected to the following tests:

(a) Low temperature curing properties

A heating condition required for curing was measured when the composition was applied in a thickness of 2 mm on a steel plate. The steel plate was heated in an oven heated with hot air.

(b) Adhesion strength

Tensile shear adhesion strength was measured according to JIS K 6850 using a glass-reinforced epoxy resin as a test piece.

(c) Penetrating properties

A time was measured, in which the urethane composition advanced in a gap of 500 μm between a pair of glass plates for a distance of 10 mm at 40° C. by the capillary action.

(d) Volume resistivity (Ω·cm)

According to JIS K 6911, a volume resistivity of the urethane composition was measured after keeping the composition at 23° C. for 1 minutes while applying a voltage of 100 V.

(e) Repairing properties

A urethane composition was applied at a thickness of 500 μm on a glass-reinforced epoxy resin plate and cured at 80° C. for 20 minutes. Then, the coated plate was placed on a hot plate, and the coated urethane composition was peeled off at a hot plate surface temperature of 210° C., 220° C. and 230° C. The repairing properties were evaluated by the peeling

TABLE 1

| Run No. | 1 | 2 | 3 | 4 | 5 | 6 | 7 |
|---|---|---|---|---|---|---|---|
| Weight ratio of PPG-based prepolymer to PH-based prepolymer | 100/0 | 90/10 | 70/30 | 50/50 | 30/70 | 10/90 | 0/100 |
| Physical property | | | | | | | |
| 50% modulus (kg/cm$^2$) | 16.5 | 20.0 | 19.3 | 25.5 | 48.7 | 59.5 | 52.9 |
| strength at break (%) | 38.7 | 40.3 | 43.9 | 53.4 | 90.9 | 78.5 | 57.5 |
| Maximum elongation (%) | 400 | 350 | 200 | 200 | 200 | 125 | 100 |
| Electrical property | | | | | | | |
| Dielectric constant (ε) | — | — | 4.97 | 4.61 | 4.23 | 3.7 | 3 |
| Dielectric dissipation factor (tan δ) | — | — | 0.0575 | 0.0428 | 0.04 | 0.0188 | 0.015 |
| Volume resistivity (Ω·cm) | $1.0 \times 10^8>$ | $1.0 \times 10^8>$ | $2.70 \times 10^{10}$ | $8.70 \times 10^{10}$ | $1.29 \times 10^{12}$ | $2.95 \times 10^{13}$ | $6.61 \times 10^{16}$ | condition of the coated urethane composition, and ranked according to the following criteria:
A: Completely removed in the peeled state
B: Almost all the cured urethane composition removed
C: Splits remain on the circuit board
D: Repairing impossible
(f) Storage stability The urethane composition was stored at 40° C. for 2 months and the viscosity of the composition was measured. Then, the increase (%) of the viscosity in comparison with the viscosity before storage was calculated.

In Comparative Example 1, the urethane composition was stored only one day, and then the viscosity was measured.

The results are shown in Table 2.

Comparative Example 1

The one-pack type thermosetting epoxy material (PENGUIN CEMENT 1090 available from SUNSTAR GIKEN) was used and subjected to the same performance tests as in Examples 1 to 4.

The results are shown in Table 2.

TABLE 2

|  | Ex. 1 | Ex. 2 | Ex. 3 | Ex. 4 | C. Ex. 1 |
|---|---|---|---|---|---|
| Mixed prepolymer | 50 | 50 | 40 | 40 |  |
| Curing agent | 13.5 | 13.5 | 15 | 15 |  |
| Plasticizer[1] | 30 | 30 | 25 | 25 |  |
| Epoxy resin[2] |  |  | 20 | 20 |  |
| Silane Coupling agent[3] | 2.5 |  |  |  |  |
| Polydimethyl-Siloxane[4] |  | 2.5 | 2.5 | 2.5 |  |
| Stabilizer[5] | 0.1 | 0.1 | 0.1 | 0.1 |  |
| Dehydrant |  |  |  | 3 |  |
| Viscosity (mPa · s) | 8000 | 6600 | 5200 | 4900 | 5600 |
| Low temperature Curing properties | 80° C. × 10 min. | 80° C. × 10 min. | 80° C. × 10 min. | 80° C. × 10 min. | 130° C. × 10 min. |
| Adhesion strength (N/mm$^2$) | 5.0 | 6.0 | 8.5 | 8.5 | 15.2 |
| Penetrating Properties (sec.) | 50 | 45 | 40 | 40 | 40 |
| Volume resistivity (Ω · cm) | 1.5 × 10$^{12}$ | 4.5 × 10$^{13}$ | 5.0 × 10$^{13}$ | 5.5 × 10$^{13}$ | 1.0 × 10$^{16}$ |
| Repairing Properties |  |  |  |  |  |
| 180° C. | C | C | C | C | D |
| 220° C. | B | B | B | B | D |
| 230° C. | A | A | A | A | D |
| Storage stability (viscosity increase: %) | 49 | 45 | Not measurable | 25 | 50 |

Notes:
[1])Tri(2-ethylhexyl) trimellitate + di(2-ethylhexyl) adipate in a weight ratio of 2:1.
[2])Bisphenol A epoxy resin (EPIKOTE ®828 available from YUKA SHELL).
[3])3-Glycidoxypropyltrimethoxy silane (KBM-351A (trade name) available from Shin-Etsu Chemical).
[4])Polyether-modified silicone (KF-351A (trade name) available from Shin-Etsu Chemical).
[5])Tetrakis[methylene-3-(3',5'-di-tert.-butyl-4'-hydoxy-phenyl)propionate]methane (ADEKA STUB AO-60 available from ASAHI DENKA KOGYO).

As can be seen from the results of Table 2, the urethane compositions of the present invention have better low temperature curing properties and storage stability than the conventional urethane material.

What is claimed is:

1. A mounted board comprising a circuit board and a semiconductor package holding semiconductor elements on a carrier substrate, wherein said semiconductor package is connected to said circuit board with solder balls, and spaces between solder connected parts are filled with an underfilling material which consists essentially of a on-pack type thermosetting urethane composition comprising:
   a urethane prepolymer having a terminal isocyanate group, which is obtained by reacting a polyol with an excessive amount of a polyisocyanate, wherein said urethane prepolymer is a mixture of a urethane prepolymer having a terminal isocyanate group comprising a hydrocarbon polyol as a polyol and a urethane prepolymer having a terminal isocyanate group comprising a polyoxyalkylene polyol in a weight ratio of 9:1 to 2:8, and
   a fine powder-coated curing agent comprising a curing agent which is in a solid state at room temperature and surface active sites of which are covered with a fine powder.

2. The mounted board according to claim 1, wherein said curing agent which is in a solid state at room temperature is at least one curing agent selected from the group consisting of imidazole compounds, imidazoline compounds, amine compounds, guanidine compounds, acid anhydrides, dibasic carboxylic acid dihydrazide, guanamines, melamine and amine adducts.

3. The mounted board according to claim 1, wherein said fine powder is one material selected from the group consisting of titanium oxide, calcium carbonate, clay, silica, zirconia, carbon, alumina, talc, polyvinyl chloride, acrylic resins, polystyrene and polyethylene.

4. The mounted board according to claim 1, wherein said one-pack type thermosetting urethane composition further comprises at least one additive selected from the group consisting of epoxy resins, organosilicone compounds and dehydrants.

* * * * *